United States Patent [19]

Sakao

[11] Patent Number: 5,629,633

[45] Date of Patent: May 13, 1997

[54] METHOD FOR PREDICTING AN OUTPUT CURRENT OF A TRANSISTOR

[75] Inventor: Eiichi Sakao, Kyoto, Japan

[73] Assignee: Rohm Co., Ltd., Kyoto, Japan

[21] Appl. No.: 588,251

[22] Filed: Jan. 18, 1996

[30] Foreign Application Priority Data

Jan. 19, 1995 [JP] Japan .................................. 7-006438

[51] Int. Cl.⁶ .................................................. G01R 31/26
[52] U.S. Cl. .................................................... 324/768
[58] Field of Search ..................................... 324/765, 766, 324/767, 768, 769, 719, 121 R; 364/487

[56] References Cited

U.S. PATENT DOCUMENTS 4,456,880  6/1984  Warner et al. ........................... 324/767
4,782,290  11/1988  Sakai et al. ............................. 324/765
4,818,934  4/1989  Tamamura ............................. 324/765

*Primary Examiner*—Ernest F. Karlsen
*Attorney, Agent, or Firm*—Nikaido, Marmelstein, Murray & Oram LLP

[57] ABSTRACT

An output current of a transistor can be predicted by a method of the present invention. A direct current amplification factor $H_{FE}(I_D)$ of the transistor is varied depending on the output current. $H_{FE0}$ is a direct current amplification factor of the transistor at a predetermined output current. $H_{FE}(I_D)/H_{FE0}$ is drawn on a graph. A value of an output current at a driving voltage is obtained by regarding the factor as a predetermined value. The value is plotted on the graph and a straight line is drawn between the plotted value and an origin of the graph. An output current at an intersection of a curve of $H_{FE}(I_D)/H_{FE0}$ and a straight line.

7 Claims, 4 Drawing Sheets

METHOD FOR PREDICTING AN OUTPUT CURRENT OF A TRANSISTOR

BACKGROUND OF THE INVENTION

1. Field of the Invention

The present invention relates to a method for predicting an output current of a transistor, and more specifically, to a method for predicting an output current of a transistor when a direct current amplification factor of the transistor is varied depending on the output current of the transistor.

2. Description of the Prior Art

Parameters such as the direct current amplification factor vary among transistors due to variations in conditions in the manufacture process. In the product inspection performed after manufacturing, the manufacturers carry out a measurement of a direct current amplification factor $H_{FE0}$ obtained at a rated (predetermined) voltage and current (e.g. 5 V, 5 mA) which is a condition of use and the transistors are delivered to the users together with the data.

For the users of the transistors who design driver circuits therefor, it is important to know how much output current is obtained when a parameter such as an input voltage is set in designing the circuits. It is therefore typical for the users to predict the output current in consideration of various conditions prior to designing.

An output current $I_D$ of a transistor part incorporating a resistor as shown in FIG. 1 is generally given by the following expression (1):

$$I_D = \left( \frac{V_I - V_{BE} \times K_5}{R_1 \times K_3} - \frac{V_{BE} \times K_5}{R_2 \times K_4} \right) \times H_{FE}(I_D) \times K_2 \quad (1)$$

where $V_I$ is an input voltage to the transistor, $V_{BE}$ is the base-emitter voltage of the transistor, $R_1$ is a resistor series connected to the input voltage to the transistor, $R_2$ is a resistor parallel connected between the base and emitter of the transistor, $H_{FE}(I_D)$ is a direct current amplification factor at the output current $I_D$ of the transistor, $K_2$ is the temperature coefficient of the direct current amplification factor of the transistor, $K_3$ is the temperature coefficient of the resistor $R_1$, $K_4$ is the temperature coefficient of the resistor $R_2$, and $K_5$ is the base-emitter temperature coefficient of the transistor.

While the output current of the transistor part incorporating a resistor is obtained by the expression (1) by setting the parameters such as the input voltage, the direct current amplification factor $H_{FE}(I_D)$ varies depending on the value of the collector current (output current). Specifically, as shown in FIG. 2, in a transistor 1, it is typical that the direct current amplification factor $H_{FE}$ plunges from a point as the collector current $I_C$ increases and that when the collector-emitter voltage $V_{CE}$ decreases as the transistor 1 conducts, the direct current amplification factor $H_{FE}$ further decreases for the same collector current. In FIG. 2, G is an example where $V_{CE}$ is 5 V and H is an example where $V_{CE}$ is 0.3 V. For this reason, the value (point P of FIG. 2) required by the specification conditions cannot be used as the direct current amplification factor. Therefore, a current amplification factor $H_{FE}$ at an output current (collector current) predicted from the graph of FIG. 2 is obtained and based on the current amplification factor $H_{FE}$, the output current $I_D$ is predicted by a calculation. However, when the calculated output current is different from the predicted output current, since they are based on different current amplification factors $H_{FE}$, the predicted output current is re-set and the calculation is performed again. These must be repeated some times to correctly predict the output current $I_D$. $K_3$ and $K_4$ are temperature coefficients which become constant and do not vary when the operating temperature is determined. $K_2$ and $K_5$ slightly vary according to the conditions of use but they can be considered constant with few errors since their variation is small.

As described above, according to the conventional output current predicting method, the complicated calculation is repeated many times to obtain an approximate value, so that the process takes a long time and is cumbersome and the output current cannot be accurately predicted.

SUMMARY OF THE INVENTION

An object of the present invention is to provide a method for accurately predicting the output current immediately by one calculation without repeating the complicated calculation.

According to the present invention, a method for predicting an output current of a transistor is provided with a first step of obtaining a relationship between a direct current amplification factor and an output current of a transistor, a second step of drawing on a graph a curve representative of a ratio of said direct current amplification factor to a direct current amplification factor of a predetermined value for said output current from said relationship between said direct current amplification factor and said collector current, a third step of obtaining an output current at a driving voltage to drive said transistor by regarding the direct current amplification factor as the direct current amplification factor of the predetermined value, a fourth step of plotting a value of the output current obtained in the third step on the graph on a same scale as the output current of the graph obtained in the second step and connecting the value to an origin where the output current is zero by a straight line, and a fifth step of reading out an output current at an intersection of the curve drawn in the second step and the straight line drawn in the fourth step.

According to the present invention, the variation of the direct current amplification factor relative to the output current of the transistor is graphed, an output current at the direct current amplification factor of the predetermined value of the transistor is obtained, and from these, an actually used output current of the transistor is obtained. As a result, the driving current is immediately obtained from the intersection on the graph and it is unnecessary to repeat the complicated calculation.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

An output current predicting method of the present invention will be described in detail with reference to the drawings.

Figure 3:
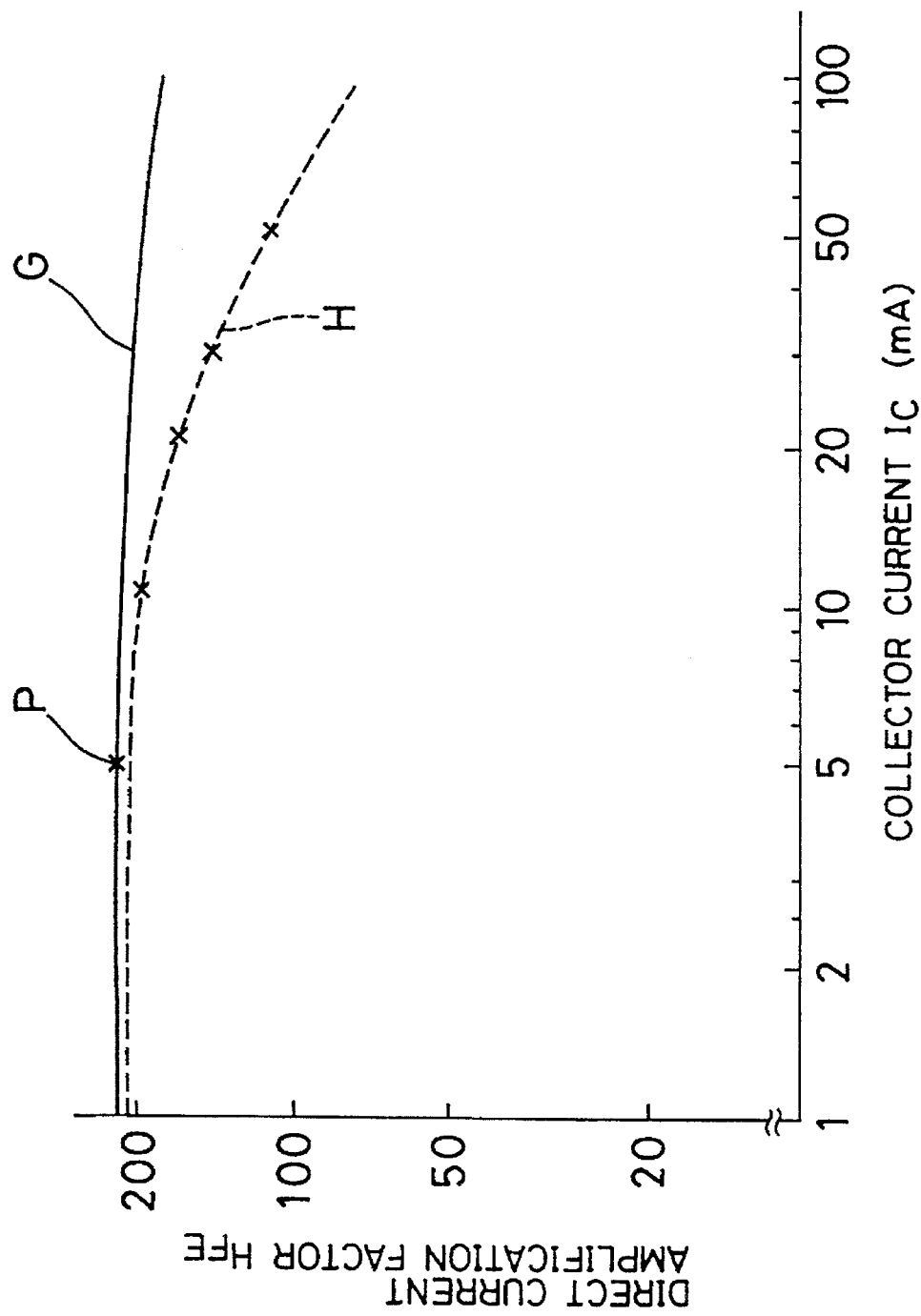
FIG. 3 is a view of assistance in explaining a manner of obtaining a curve of $K_1$ of FIG. 4.
Figure 4:
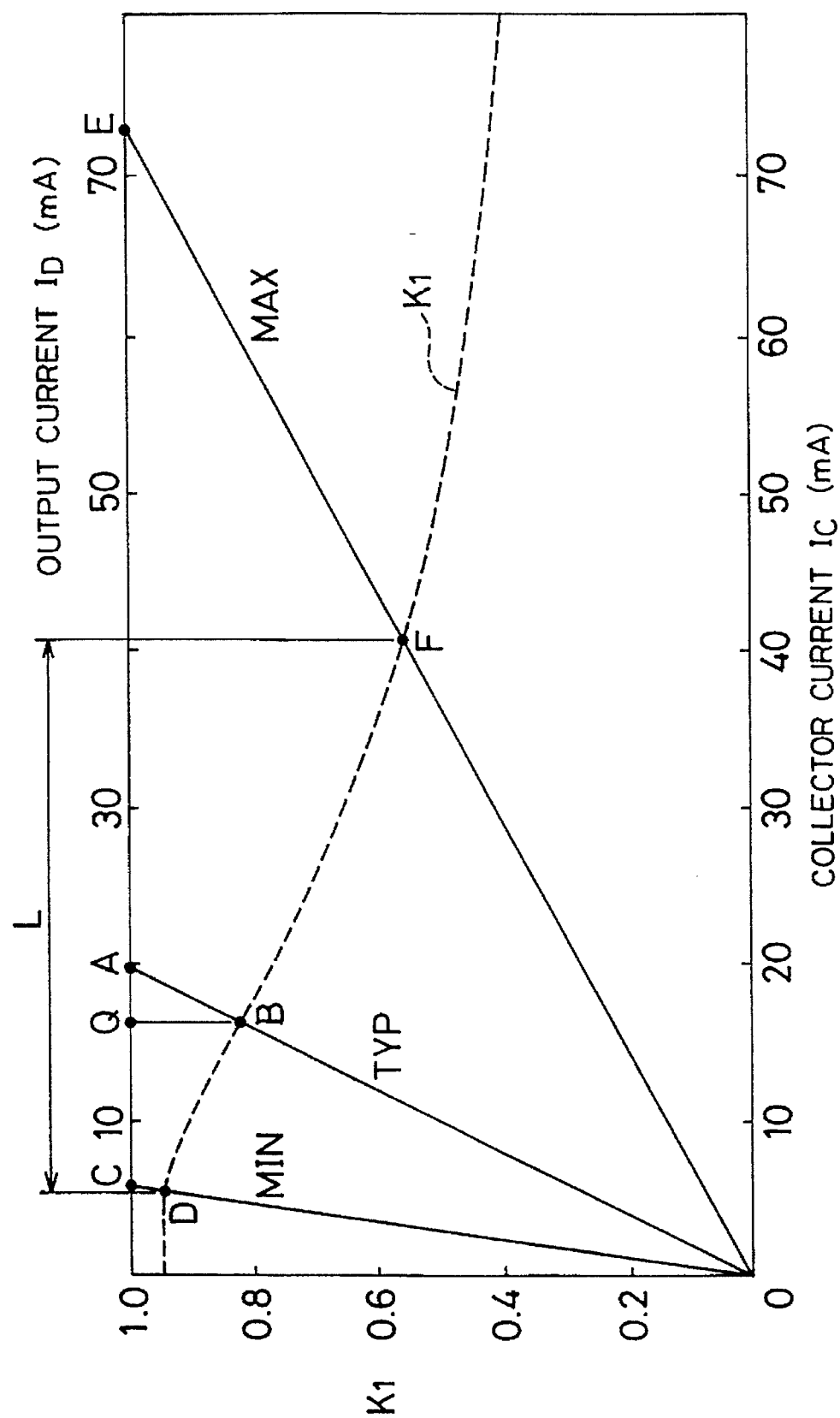
FIG. 4 is a view of assistance in explaining an embodiment of an output current predicting method of the present invention.

FIG. 4 is a view of assistance in explaining an embodiment of the output current predicting method of the present invention. FIG. 3 is a view of assistance in explaining a manner of obtaining a variation $K_1$ of the direct current amplification factor used for the output current predicting method of the present invention. In this embodiment, as is apparent from FIG. 1, the output current is the same as the collector current.

The output current $I_D$ of a transistor is predicted by the calculation of the expression (1) as set forth above. However, the expression (1) includes on its right side the direct current amplification factor $H_{FE}(I_D)$ which is a function of the output current $I_D$ and the output current cannot be univocally predicted by the calculation. In the present invention, to solve this problem, the direct current amplification factor $H_{FE}(I_D)$ which is a function of $I_D$ is factored into the product of a direct current amplification factor $H_{FE0}$ of a predetermined value depending on conditions such as the specification conditions and the variation $K_1$ of the direct current amplification factor $H_{FE}(I_D)$ depending on the output current $I_D$ so that $H_{FE}(I_D)=K_1 \cdot H_{FE0}$, and $H_{FE}(I_D)$ and $H_{FE0}$ are obtained independently.

Figure 1:
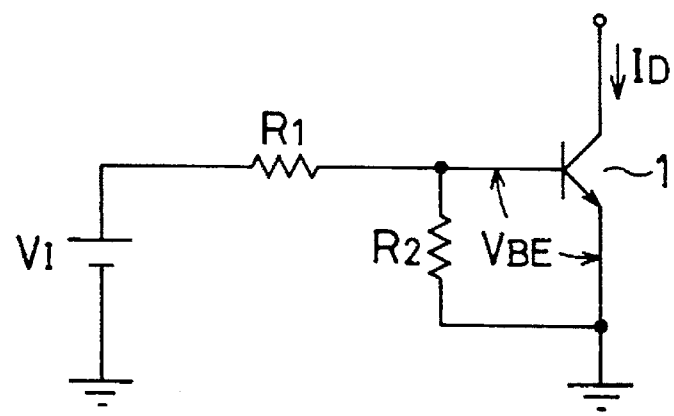
FIG. 1 is an equivalent circuit diagram of an example of a transistor to which the present invention is directed.

(a) First, as shown in FIG. 3, the variation in direct current amplification factor $H_{FE}$ for a collector current $I_C$ of the transistor 1 of FIG. 1 is obtained. The variation in $H_{FE}$ is obtained, for example, by using a general-purpose $H_{FE}$ measuring apparatus or a curve tracer. G is an example when the collector-emitter voltage $V_{CE}$ of the transistor is 5 V and H is an example when $V_{CE}$ is 3 V.

Figure 2:
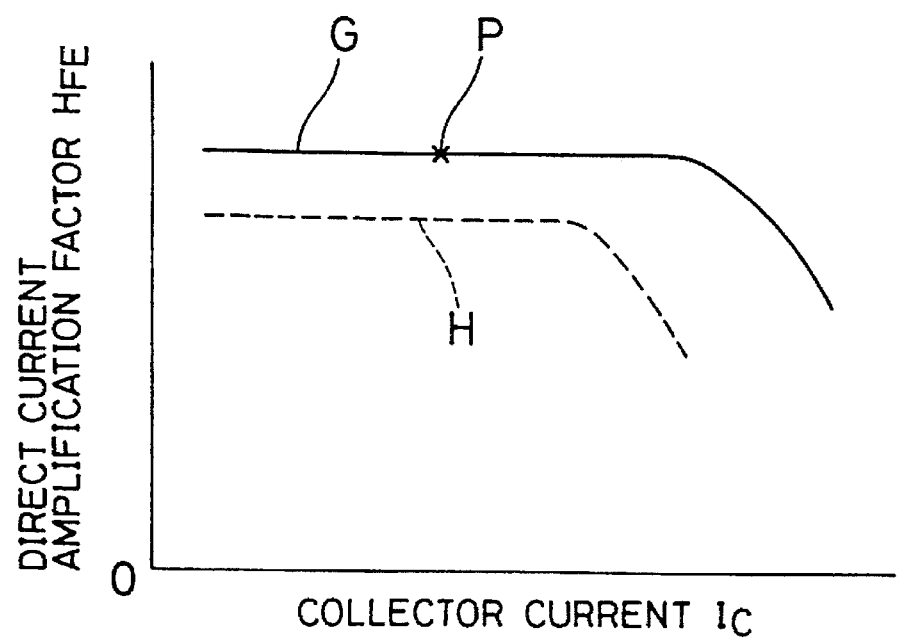
FIG. 2 shows how the direct current amplification factor $H_{FE}$ varies for the collector current of the transistor.

(b) Then, the direct current amplification factor $H_{FE}$ for each of the collector currents obtained from the above-described relationship is divided by a direct current amplification factor (point P of FIG. 2) of a predetermined condition (e.g. the driving voltage is 5 V and the collector current $I_C$ is 5 mA) to obtain $K_1=H_{FE}(I_D)/H_{FE0}$ and a graph is drawn as shown by $K_1$ of FIG. 4.

(c) Then, for the expression (2) in which the direct current amplification factor $H_{FE}(I_D)$ of the expression (1) is replaced by the direct current amplification factor $H_{FE0}$, circuit constants and set values such as the resistors $R_1$ and $R_2$ and the input voltage $V_1$ associated with the transistor are substituted to obtain an output current $I_{D0}$:

$$I_{D0} = \left( \frac{V_I - V_{BE} \times K_5}{R_1 \times K_3} - \frac{V_{BE} \times K_5}{R_2 \times K_4} \right) \times H_{FE0} \times K_2 \quad (2)$$

The output current $I_{D0}$ is a value obtained by ignoring the variation of the direct current amplification factor which actually varies depending on the output current and by regarding the amplification factor as the amplification factor $H_{FE0}$ of the predetermined value.

In the expression (2), the other variables are the same as those of the expression (1).

(d) Then, as shown in FIG. 4, the value of $I_{D0}$ obtained in the above step (c) is plotted (point A) as $K_1=1$ on the same graph in which $K_1$ is graphed and a straight line is drawn to connect the point A and the point 0 (origin) where the collector current is 0.

(e) Then, a value Q is read out which is at the foot of the perpendicular from an intersection B of the straight line A0 obtained in the above step (d) and the curve $K_1$ obtained in the step (b) to the scale of the output current.

The value Q read out in the step (e) is the predicted value of the output current $I_D$ to be obtained. The predicted value is thus obtained by one calculation while considering the variation in direct current amplification rate which varies depending on the output current.

Figure 5:
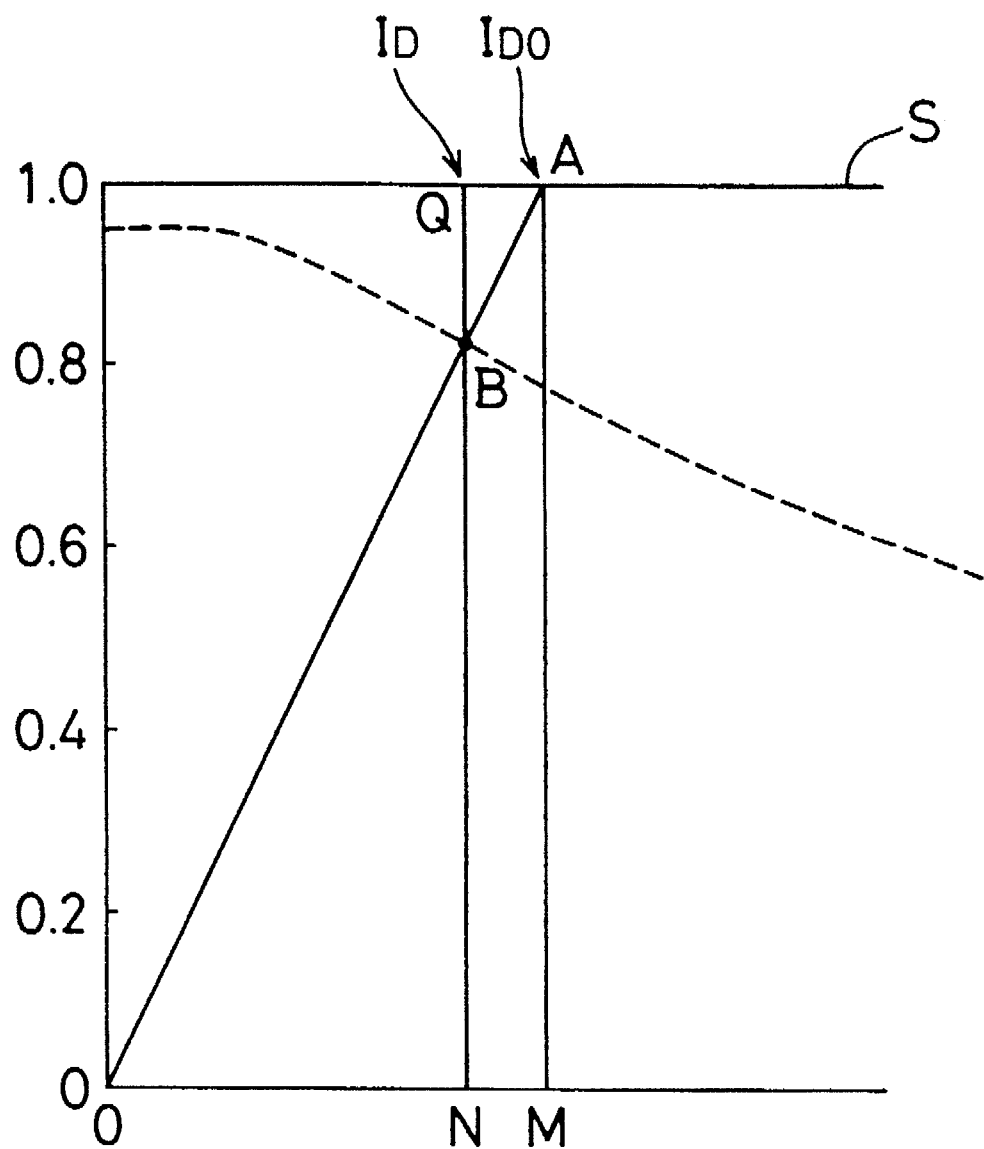
FIG. 5 shows a prime portion of FIG. 4.

Referring to FIG. 5, there is shown a prime portion of FIG. 4. In this figure, lines AM and BN are drawn. With this figure, it will be described that the value Q at the foot of the perpendicular from the point B to the scale S represents the predicted value $I_D$ of the output current. Since a triangle AOM and a triangle BON are similar triangles, the following relationship holds:

$$OM: ON = AM: BN \quad (3)$$

OM, ON, AM and BN are all segments. Here, AM is K=1 and BN is $K=H_{FE}(I_D)/H_{FE0}$. On the other hand, PM is $I_{D0}$ and PN is $I_D$. Therefore, the relationship (3) is rewritten to:

$$I_{D0}: I_D = 1: H_{FE}(I_D)/H_{FE0}$$

From this, $I_D=[H_{FE}(I_D)/H_{FE0}] \times I_{D0}$. Thus, it is understood that there is no contradiction in regarding the value Q as the predicted value $I_D$ to be obtained.

While a transistor device incorporating the resistors $R_1$ and $R_2$ is described in the above embodiment, the output current is easily predicted similarly for normal transistors having external resistors connected thereto.

Further, according to the present invention, the output current $I_D$ is easily obtained if parameters such as the circuit constant are decided, so that a width L (see FIG. 4) is easily obtained between the minimum output current and the maximum output current of a transistor part incorporating a resistor. Specifically, the resistance values of resistor incorporating transistor parts vary by approximately ±30% in manufacturing. In order to find how the output current varies with the variation in resistance value, the output current $I_{D0}$ calculated by the expression (2) is obtained for the minimum variation value (MIN) and for the maximum variation value (MAX), the points C and E of FIG. 4 are plotted and connected to the point 0 by straight lines, and the intersections of the straight lines and the curve $K_1$ are denoted by D and F, so that the variation range L of the output current is easily obtained. Specifically, in the example shown in FIG. 1, while the standard output current $I_D$ (TYP) is 16.5 mA (milliampere), the minimum output current $I_D$ (MIN) is 5.5 mA and the maximum output current $I_D$ (MAX) is 41 mA. Thus, the output current varies in a range between 5.5 to 41 mA. For this reason, when the transistor part incorporating a resistor is used which is designed to have a standard output current of 16.5 mA, the driver circuit is designed so that it can drive the transistor even at the minimum output current $I_D$ of 5.5 mA. This range of use is important not only for the circuit design engineers who designs driver circuits by using resistor incorporating transistor parts but also for the manufacturers who design resistor incorporating transistor parts suitable for users' purposes and it is easy for both the design engineers and manufacturers to obtain design guidelines.

According to the present invention, by drawing graphs, the output current depending on intricately correlated factors is easily predicted. As a result, a simulation is easily performed to determine how much the values and variations of various factors should be in order to eventually obtain a necessary output current. Users may be provided with the graph together with the transistor. The users may execute only the above-mentioned steps (c) to (d).

For the manufacturers of the resistor incorporating transistor parts, which factor largely contributes to the output current is easily grasped by using the method of the present invention for the process design and the circuit design such as the design of resistance values. As a result, high-performance transistors are easily designed.

For the users (circuit design engineers), since the output current in the worst case is easily grasped, the set trouble caused by a insufficient output current is prevented. As a result, highly reliable electronic apparatuses are manufactured.

Obviously, many modifications and variations of the present invention are possible in light of the above teachings. It is therefore to be understood that within the scope of the appended claims, the invention may be practiced other than as specifically described.

What is claimed is:

1. A method for predicting an output current of a transistor, comprising:

a first step of obtaining a relationship between a direct current amplification factor and an output current of a transistor;

a second step of drawing on a graph a curve representative of a ratio of said direct current amplification factor to a direct current amplification factor of a predetermined value for said output current from said relationship obtained in the first step;

a third step of obtaining an output current at a driving voltage to drive said transistor by regarding the direct current amplification factor as a direct current amplification factor of a predetermined value;

a fourth step of plotting a value of the output current obtained in the third step on the graph on a same scale as the output current of the graph obtained in the second step and connecting the plotted value to an origin where the output current is zero by a straight line; and a fifth step of reading out an output current at an intersection of the curve in the second step and the straight line in the fourth step.

2. A output current predicting method according to claim 1, wherein the output current in the third step is obtained by $$I_{D0} = \left( \frac{V_I - V_{BE} \times K_5}{R_1 \times K_3} - \frac{V_{BE} \times K_5}{R_2 \times K_4} \right) \times H_{FE0} \times K_2$$

where $V_I$ is an input voltage to the transistor, $V_{BE}$ is a base-emitter voltage of the transistor, $R_1$ is a resistor series connected to the input voltage to the transistor, $R_2$ is a resistor parallel connected between a base and an emitter of the transistor, $H_{FE0}$ is a direct current amplification factor at a predetermined current of the transistor, $K_2$ is a temperature coefficient of the direct current amplification factor of the transistor, $K_3$ is a temperature coefficient of the resistor $R_1$, $K_4$ is a temperature coefficient of the resistor $R_2$, and $K_5$ is a temperature coefficient of the base-emitter voltage of the transistor.

3. An output current predicting method according to claim 2, wherein said transistor is a transistor part incorporating a resistor.

4. An output current predicting method according to claim 1, wherein said graph includes a first axis and a second axis intersecting at the origin, said first axis representing the output current, said second axis representing the ratio between the two direct current amplification factors.

5. An output current predicting method according to claim 4, wherein said value of the output current obtained in the third step is plotted on a line where the ratio is 1.

6. An output current predicting method according to claim 1, wherein said first and second steps are carried out in advance and a resulting graph is provided together with the transistor.

7. An output current predicting method according to claim 6, wherein on the provided graph, a minimum value and a maximum value of the output current calculated by a same method as the method of the third step are plotted in a similar manner to the manner of the fourth step, said minimum and maximum values each being connected to the origin by a straight line.

* * * * *